United States Patent [19]

Hiratsuka et al.

[11] Patent Number: 5,796,238
[45] Date of Patent: Aug. 18, 1998

[54] BATTERY PACK

[75] Inventors: Masaru Hiratsuka, Kanagawa; Shigeki Murayama, Tokyo; Tamiji Nagai; Yasuhito Eguchi, both of Kanagawa, all of Japan

[73] Assignee: Sony Corporation, Japan

[21] Appl. No.: 244,781

[22] PCT Filed: Oct. 13, 1993

[86] PCT No.: PCT/JP93/01471
§ 371 Date: Aug. 1, 1994
§ 102(e) Date: Aug. 1, 1994

[87] PCT Pub. No.: WO94/09527
PCT Pub. Date: Apr. 28, 1994

[30] Foreign Application Priority Data

Oct. 13, 1992 [JP] Japan ............... 4-274237

[51] Int. Cl.$^6$ ............... H01M 10/44; H01M 10/46
[52] U.S. Cl. ............... 320/5; 320/22; 320/30; 429/22
[58] Field of Search ............... 320/5, 21, 22, 320/30; 429/22, 58

[56] References Cited

U.S. PATENT DOCUMENTS

| | | | |
|---|---|---|---|
| 5,136,229 | 8/1992 | Galvin | 320/2 |
| 5,254,928 | 10/1993 | Young et al. | 320/21 |
| 5,282,054 | 1/1994 | Oana et al. | 358/406 |
| 5,371,456 | 12/1994 | Brainard | 320/31 |

FOREIGN PATENT DOCUMENTS

| | | |
|---|---|---|
| 0406858 | 1/1991 | European Pat. Off. . |
| 0432639 | 6/1991 | European Pat. Off. . |
| 0479249 | 4/1992 | European Pat. Off. . |
| 54-131732 | 10/1979 | Japan . |
| 5953768 | 4/1984 | Japan . |
| 60-219927 | 11/1985 | Japan . |
| 1-318512 | 12/1989 | Japan . |

*Primary Examiner*—Thorl Chea
*Attorney, Agent, or Firm*—Ronald P. Kananen

[57] ABSTRACT

A battery pack (1) is connected to an external circuit (9) and to a power source circuit (10) which is also connected to the external equipment (9). The battery pack (1) is discharged to supply the current to the external equipment (9) or is charged by the current supplied from the power source circuit (10). An analog circuit (12) and a micro-computer (11) within the battery pack (1) detect the on/off state of the external circuit (9) and effect charging in the on-state of the external equipment with the power equal to the total supply power from the power source circuit less the maximum power consumed by the external equipment, while effecting charging during the off-state of the external equipment with the supply power from the power source circuit. The charging/discharging control is performed by the on/off control by the micro-computer (11) of a charging switch (S1), a discharging switch (S2) and a switch (S4).

48 Claims, 8 Drawing Sheets

BATTERY PACK

TECHNICAL FIELD

This invention relates to a battery pack employed as a power source for a portable telephone, personal computer or a video camera.

BACKGROUND ART

There has hitherto been known a battery pack constituted by a secondary cell, such as a lithium ion cell, NiCd cell or a nickel hydrogen cell. Such known battery pack arrangements are in need of a protective circuit which is arranged at a pre-set position within the battery pack. A charging control circuit is separately provided on a charger such as an ac adapter or on an external unit such as a personal computer employing the battery pack. If an excess discharging state is detected, the discharge is discontinued appropriately.

However, the voltage at each cell cannot be detected based solely upon the terminal voltage of the battery pack, such that the residual capacity cannot be measured accurately. Besides, if any one of the cells reaches a pre-set over-discharge voltage, the discharge is discontinued without regard to the terminal voltage.

This is particularly inconvenient with equipment, such as a personal computer, in which it is necessary to carry out an operation of data storage before discontinuing the discharge.

On the other hand, the control circuit needs to be designed uniquely in order to adapt it to the characteristics of the secondary cell of the battery pack. If the control circuit is provided outside of the battery pack, the problem of interchangeability between the charger and the secondary cells arises with inconveniences in safety and costs. It has therefore been desired to provide a small-sized compact battery pack in which control may be made so as to take account of the characteristics of the cells of the secondary battery of the battery pack and in which the load imposed on the external equipment used with the battery pack may be minimized.

In addition, when charging the battery pack with the power supplied from a power circuit connected to the external equipment, it is necessary to change over the charging operation depending on whether the external equipment is in the turned-on state or in the turned-off state.

In view of the above-described status of the art, it is an object of the present invention to provide a battery pack in which the charge/discharge operation may be performed on the side of the battery pack and in which appropriate charge/discharge control may be made depending on the state of the external equipment in such a manner as to take account of the cell characteristics.

DISCLOSURE OF THE INVENTION

The present invention provides a battery pack connected to a power source circuit and to external equipment connected to the power source circuit. The battery pack comprises means for detecting the on/off states of the external equipment and effecting charging in the turned-on state of the external equipment with the power equal to the total supplied power from the power source circuit less the maximum power consumed by the external equipment, and also effecting charging during the turned-off state of the external equipment with the supplied power from the power source circuit.

In this manner, the battery pack may be charged properly without adversely affecting the power supply to the external equipment.

In the turned-on state of the external equipment, charging is performed with low current obtained by switching control of the current supplied from the power source circuit. It is preferred to effect the charging under constant current control by constraining the current from the power source circuit to a constant low current value.

It is also possible to detect the voltage difference among the cells when charging has been terminated and to discharge the cell having the highest voltage if the voltage difference is higher than a pre-set threshold value in order to maintain what may be termed a cell voltage balance for suppressing voltage fluctuations.

By switching the discharge switch on when charging is terminated, or by detecting the voltage state of the power source circuit and controlling the discharging switch in response on the detected state of the power source, it becomes possible to supply the discharging current instantly from the battery pack to the external equipment even if the power source circuit is turned off during the turned-on state of the external equipment.

Furthermore, by providing a battery loading terminal to which a voltage is applied on battery loading, and by changing over the internal circuit between the operation and the non-operation depending on the voltage applied to the battery loading terminal, it becomes possible to assure protection for such cases wherein the power source terminals of the battery pack are shorted or other chargers are employed.

BEST MODE FOR CARRYING OUT THE INVENTION

Figure 1:
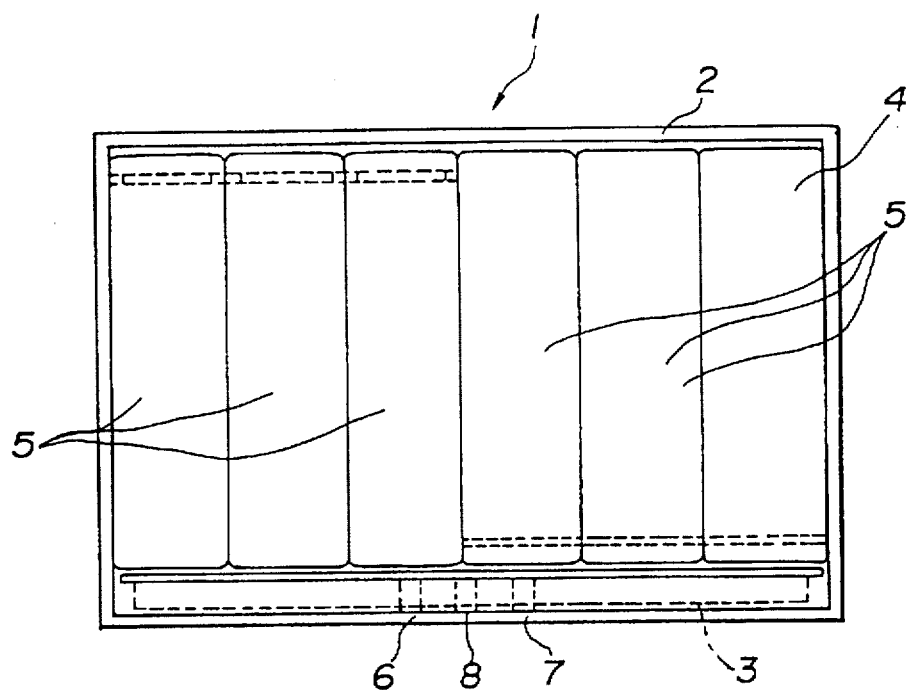
FIG. 1 is a schematic plan view showing a structure of an embodiment of a battery pack according to the present invention.

Referring to the drawings, preferred embodiments of the battery pack according to the present invention will be explained.

A battery pack 1 of the present embodiment is made up of a control/protection circuit 3 and a main battery unit 4 provided within a container casing 2, as shown in FIG. 1. The control/protection circuit 3, with a built-in charge/ discharge control function, a built-in communication function and a protective circuit, is suitably arranged in position within the container casing 2.

The main battery unit 4 is comprised of, for example, six cells 5. These six cells 5, termed 3P2S, are arranged in sets of cells connected in series, each set being made up of three cells connected in parallel.

The main battery unit 4 also includes a negative terminal 6, a positive terminal 7 and an external connection terminal 8 at suitable positions capable of being connected to an external charger and external equipment 9 provided outside the container casing 2.

The number of cells 5 of the battery main unit 4 is not limited to six and may be suitably increased or decreased. The connections between of the cells 5 may also be changed in any desired manner.

Figure 2:
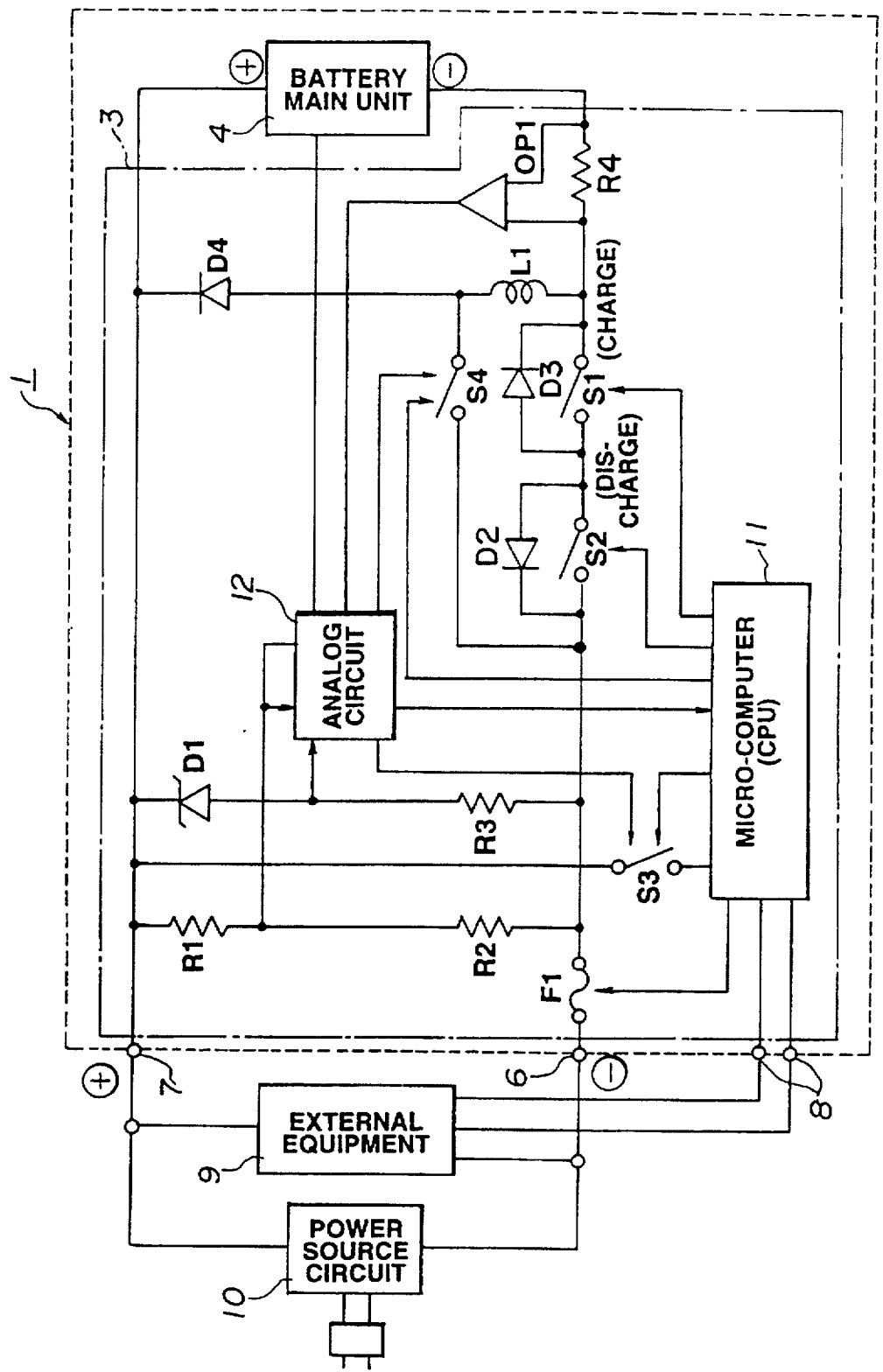
FIG. 2 is a schematic block circuit diagram showing the structure of a circuit of the embodiment of the battery pack according to the present invention and a peripheral circuit.

The battery pack 1, comprised of the control/protection circuit 3 and the main battery unit 4, has its negative terminal 6, positive terminal 7 and the external connection terminal 8 connected to the negative and positive sides of the external equipment 9 and a power source circuit 10, such as an ac/dc converter, and to the external equipment 9, respectively, as shown in FIG. 2, in order to effect the charge/discharge operations for the main battery unit 4.

The control/protection circuit 3 is comprised of a microcomputer 11, an analog circuit 12, resistors R3 and R4, diodes D1, D2 and D3, switches S1, S2, S3 and S4 and an operational amplifier OP1.

The state of interconnection between the control/protection circuit 3 and the main battery unit 4 will now be explained.

The positive terminal 7, connected with the positive sides of the external equipment 9 and the power source circuit 10, is connected to an end of a resistor R1, an end of the control/protection circuit 3, a cathode side of the diode D1 and to a positive terminal of the main battery unit 4.

The resistor R1 has its other end connected to an end of a resistor R2 and to a terminal of the analog circuit 12.

The resistor R2 has its other end connected via a fuse F1 to the negative terminal 6.

The resistor R3 has one end connected to the anode side of the diode D1 and to an input terminal of the analog circuit 12, while having its other end connected via the fuse F1 to the negative terminal 6.

The resistor R4 has its one end connected to the switch S1, the cathode side of the diode D3, an end of a coil L1 and to one input terminal of the operational amplifier OP1, while having its other end connected to the other input terminal of the operational amplifier OP1 and to the negative terminal of the battery main unit 4.

The diode D1 is a Zener diode which has its anode side connected to one end of the resistor R3 and to the input terminal of the analog circuit 12 and which has its cathode side connected to the positive terminal 7.

The diode D2 has its anode side connected to one terminal of the switch S1, the other terminal of the switch S2 and to the anode side of the diode D3, while having its cathode side connected via the fuse F1 to the negative terminal 6.

The diode D3 has its anode side connected to one terminal of the switch S1, the other terminal of the switch S2 and to the anode side of the diode D2, while having its cathode side connected to a terminal of the switch S1, the other terminal of the coil L1, the one input terminal of the operational amplifier OP1 and to one terminal of the resistor R4.

The diode D4 has its anode side connected to one terminal of the coil L1 and to a terminal of the switch S4, while having its cathode side connected to the positive terminal 7.

The switch S1, which is turned on during the charging operation of the battery main unit 4, has its one terminal connected to the anode side of the diode D3, the anode side of the diode D2 and to a terminal of the switch S2, while having its other terminal connected to the cathode side of the diode D3, a terminal of the coil L1, an input terminal of the operational amplifier OP1 and to one terminal of the resistor R4 and having its control terminal connected to an output terminal of the micro-computer (CPU) 11.

The switch S2, which is turned on during the discharging of the battery main unit 4, has one terminal connected via the fuse F1 to the negative terminal 6, to one terminal of the switch S4 and to the cathode side of the diode D2, while having its other terminal connected to the anode side of the diode D2, the anode side of the diode D3 and to one input terminal of the switch Si and having its control terminal connected to the output terminal of the micro-computer (CPU) 11.

The switch S4, which is turned on and off based upon a command from the micro-computer 11 and the analog circuit 12, has its one terminal connected a other terminal of the switch S2, and the cathode side of the diode D2, while having its other terminal connected to the anode side of the diode D4 and to one terminal of the coil L1 and its control terminal connected to the output terminal of the micro-computer 11 and to the output terminal of the analog circuit 12.

The operational amplifier OP1, detects excessive current and whether the battery unit 4 is charging or discharging, and is connected to the other terminal of the switch S1, the cathode side of the diode D3, a terminal of the coil L1 and to the negative side of the battery main unit 4.

The fuse F1, which is turned on and off based upon a signal from the micro-computer 11, has its one terminal connected to the negative terminal 6, while having its other terminal connected to a terminal of the resistor R2, a terminal of the resistor R3, the cathode side of the diode D2 and to one terminal of the switch S2 and its control terminal connected to the output terminal of the micro-computer 11.

The micro-computer 11, controlling the charging/discharging of the battery main unit 4 and the protective circuit inclusive of the analog circuit 12, has plural input terminals, that is terminals controlling the switches S1 to S4, a terminal for acquiring information from the analog circuit 12, a terminal connected to a terminal of the switch S3, a terminal controlling the fuse F1 and an external control terminal 8 for controlling the external equipment 9.

The analog circuit 12, comprising a circuitry for controlling the battery main unit 4 and for accommodating for shorting or the like, has an input terminal to which signals from the battery main unit 4 enter, a terminal for controlling the switches S3 and S4, a terminal for transmitting information to the micro-computer 11 and a terminal for detecting unusual input/output voltages.

It has heretofore been necessary to provide a protection circuit, comprising an operational amplifier OP1 and the resistor R4 for detecting the constant current or voltage, inside the power source circuit 10 and inside the battery pack 1. However, with the above arrangement, it is sufficient to provide only one protection circuit within the battery pack 1.

The protection circuit may also be comprised of the diode D1 and the resistor R3 and designed to detect an unusual input voltage. Such a protection circuit presents charging the battery pack with the power source circuit when for example, the voltage of the power source circuit reaches an unusual value.

In addition, the analog circuit 12 monitors the states of the cells 5 of the battery main unit 4. That is, the analog circuit 12 detects the state of voltage or the charge/discharge current of each cell 5 and suitably transmits the detected state to the micro-computer 11.

For example, if the charge/discharge operation of the battery main unit 4 is completed, a signal indicating that is transmitted to the micro-computer 11 for turning the switch S2 off. On the other hand, if unusual situations arise in the battery main unit 4 during the charging operation or the discharging operation, such as when an excessively charged state or an excessively discharged state occur, the analog circuit 12 controls the switch S1 or S2 to halt the charging operation or the discharging operation as needed.

If, during charging of the battery pack 1 by a power source circuit 10 such as an ac/dc converter, the charging voltage deviants significantly from an expected value, the analog circuit 12 detects the partial voltage value from the protection circuit made up of the resistors R1 and R2 and transmits a signal to stop the charging operation to the micro-computer 11. The micro-computer 11 breaks the fuse F1 in response to this signal in order to prevent the battery main unit 4 from being destroyed.

In this manner, by providing the described protection circuit in the battery pack 1 instead of within the power source circuit 10 and by incorporating control circuits performing various control operations in the battery pack 1, the battery pack 1 is itself able to achieve the protection of the cells 5 and the charging/discharging control.

The operation of the control/protection circuit 3 is controlled in accordance with the pre-set flowchart stored within the micro-computer 11. Referring to FIGS. 3 to 7, a typical set of operations for a 3P-2S type battery pack, comprising three parallel rows each consisting of two series connected cells, is explained.

Figure 3:
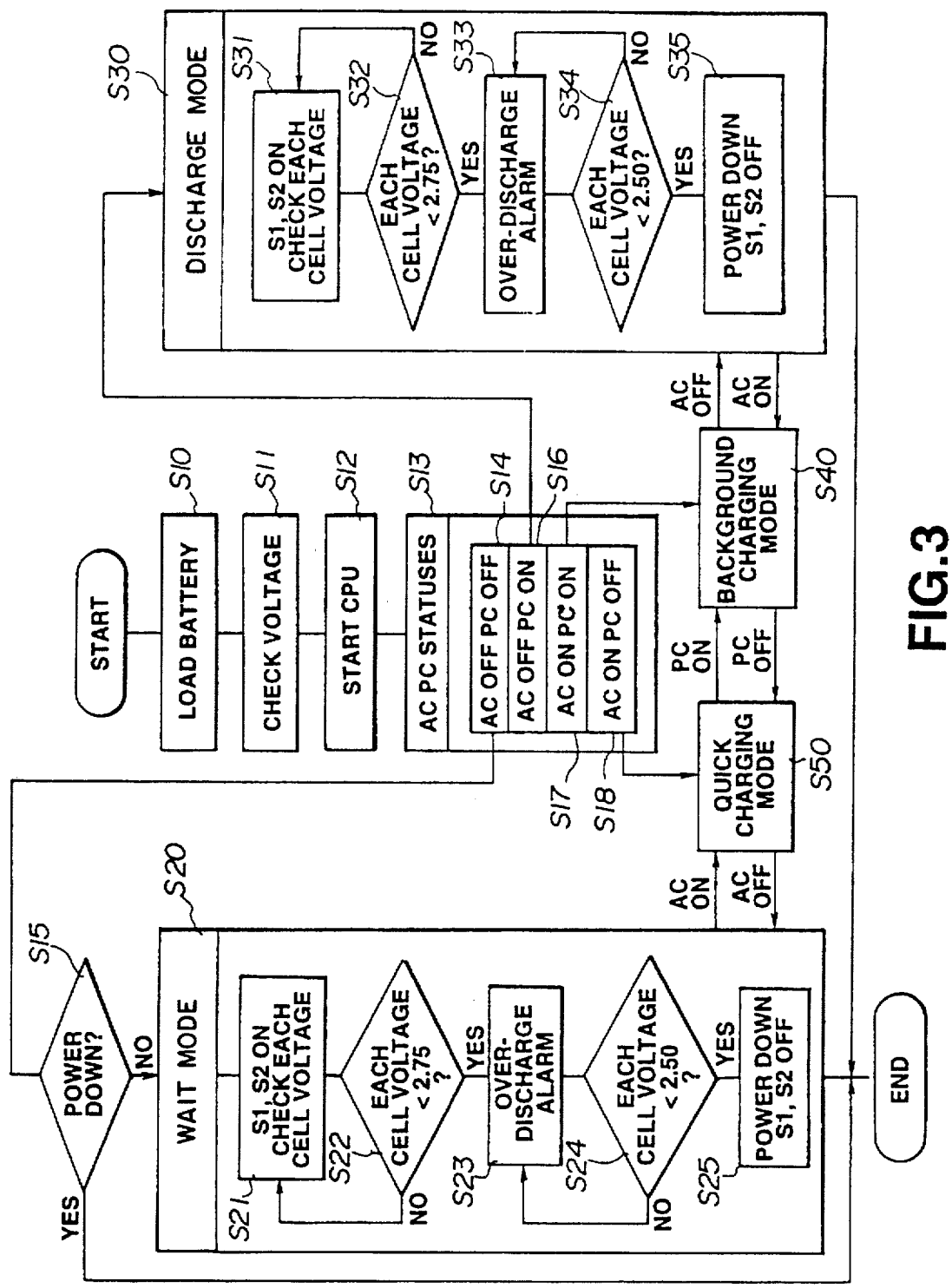
FIG. 3 is a flowchart for schematically illustrating the overall charge/discharge control operations of the embodiment of FIGS. 1 and 2.

Referring to FIG. 3, when the battery pack is loaded at a step S10, the voltage is checked at a step S11 by the analog circuit 12. Specifically, the partial voltage values from the voltage divider circuit made up of the resistors R1 and R2 are detected by the analog circuit 12 in order to check whether or not the voltage is within the normal voltage range. If the voltage is the normal voltage, control proceeds to a step S12 for starting the micro-computer (CPU) 12 within the battery pack 1.

At the next step S13, the status of the ac power source of the power source circuit 10 and the status of the personal computer (PC) as a specific example of the external equipment 9 are detected the AC (power source)/PC (external equipment) status depending on various modes are selected.

If the AC/PC state is found to be AC (power source) off and the PC (external equipment) off (S14), control proceeds to a step S15 to determine whether or not to power down. If the result of the decision is YES (power down), the operation is ended. If the result is NO, control proceeds to the wait or stand-by mode S20. If the AC/PC state is found at the step S13 to be AC (power source) off and the PC (external equipment) on (S16), control proceeds to a discharge mode (S30). If the AC/PC state is found at the step S13 to be AC (power source) on and the PC (external equipment) on (S17), control proceeds to a background charging mode (S40). If the AC/PC state is found at the step S13 to be AC (power source) on and the PC (external equipment) off (S18), control proceeds to a quick charging mode (S50).

Among these modes, the discharge mode (S30) is the mode of driving the external equipment 9, such as the personal computer, with the battery. During this mode, both the switches S1 and S2 are turned on in order to detect the voltage of the cells 5 in the battery main unit 4 (in effect, the cells connected in parallel). The reason of detecting the cell voltage in the battery main unit 4 is, to determine whether the cells are excessively discharged. Since the cells are discharged and the voltage is thereby lowered, such voltage is checked, so that, at the next step S32, the voltage values in the cells 5 are compared to a pre-set threshold voltage, such as 2.75 V, which represents an excessively discharged state.

If the voltage state in each cell 5 becomes lower than the above-mentioned threshold value (2.75 V), control proceeds to the next step S33 to issue an alarm that the excessively discharged state exists and to prompt the external equipment to stop its operation. At the next step S34, it is determined whether the voltage is lower than a voltage at which re-charging becomes impossible, such as 2.50 V. Until such a voltage is reached, the discharge is continued while simultaneously the alarm concerning the excessively discharged state is issued in order to enable, for example, the user of a personal computer to save work being performed.

If the voltage is found at the step S34 to be lower than the voltage of 2.50 V, control proceeds to a step S35 to force the power-down state of the battery pack 1. The switches S1 and S2 are both turned off to terminate the power supply to the external equipment 9.

Among the above-mentioned various modes, the operation in the wait mode S20 is the same as that for the discharge mode S30. However, since the external equipment 9 is turned off, the discharge current is extremely low. The operating steps S21, S22, S23, S24 and S25 of the wait mode S20 correspond to the operating steps S31, S32, S33, S34 and S35 of the discharge mode S30.

Figure 4:
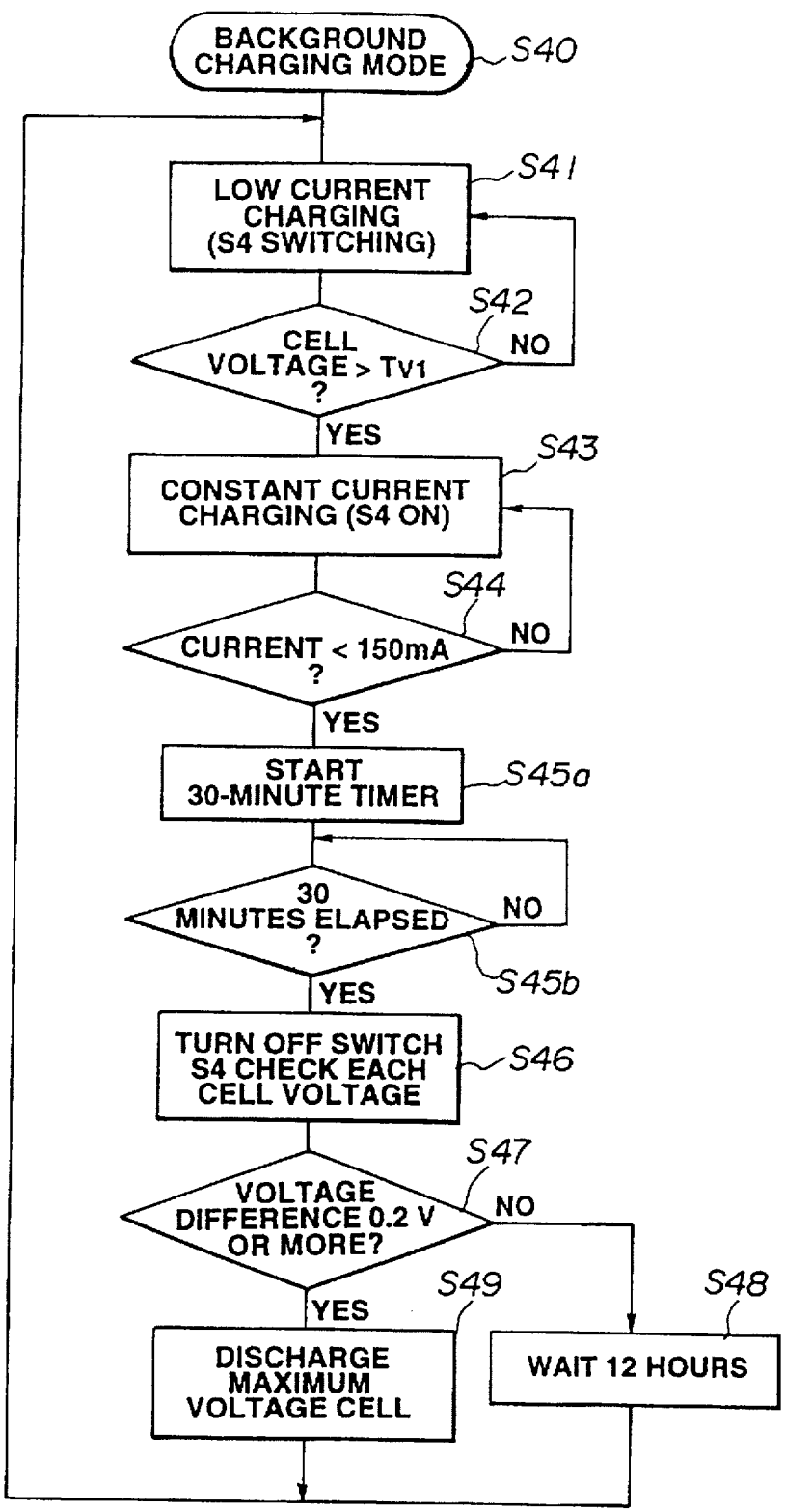
FIG. 4 is a flowchart for illustrating the background charging mode among the charge/discharging control operations of the embodiment of FIGS. 1 and 2.
Figure 5:
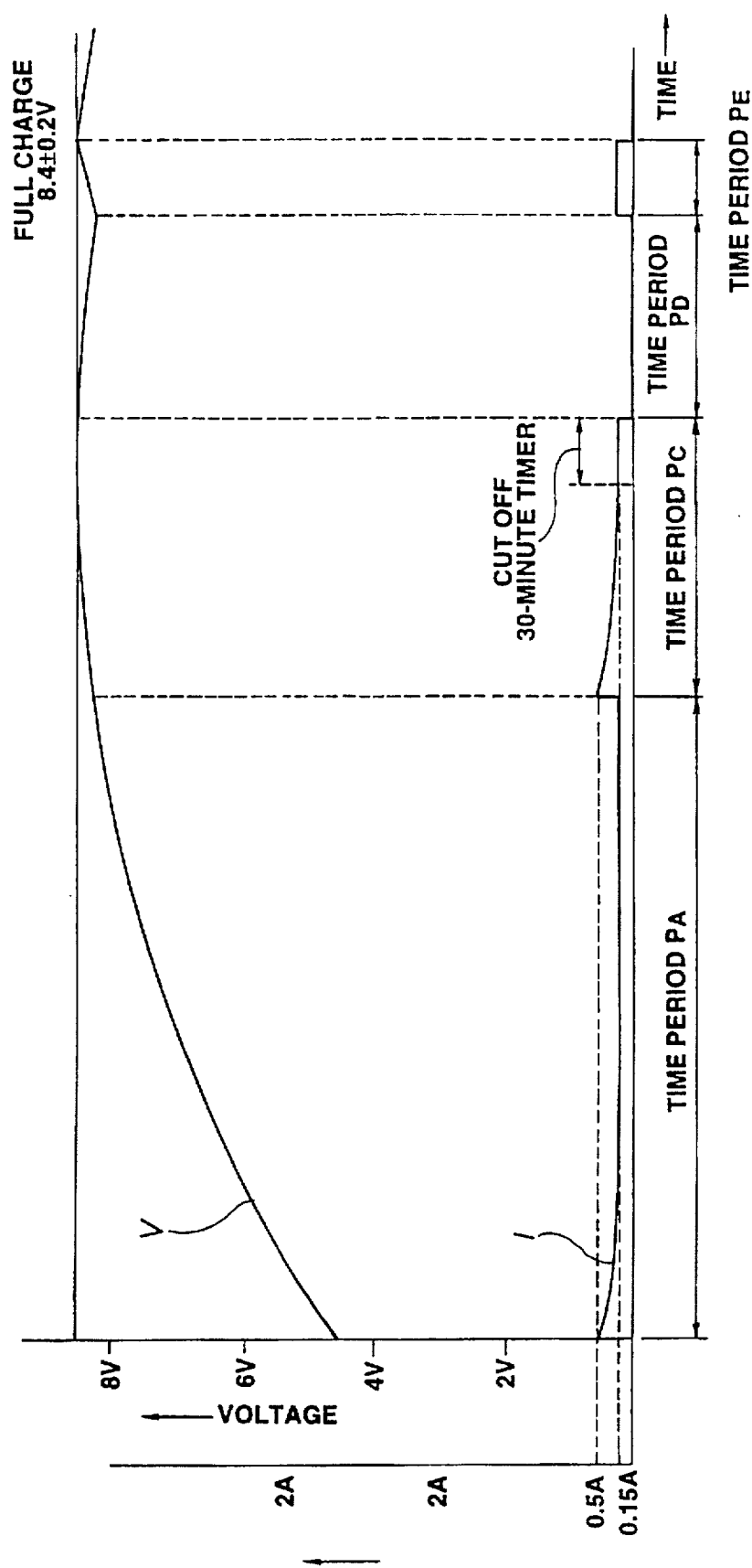
FIG. 5 is a graph showing changes in the current and the voltage with lapse of time for the background charging mode.

The background charging mode S40, which is established when the AC (power source)/PC (external equipment) state is determined to be such that the AC (power source) is on and the PC (external equipment) is on (S17), is explained by referring to the flowchart of FIG. 4 and the charging transition schema (charging process diagram) of FIG. 5.

The background charging mode, which is established when the AC/PC state is the AC (power source) on and the PC (external equipment) on, is the mode in which the battery main unit 4 of the battery pack 1 is charged during the time when the external equipment 9 is turned on and the power is supplied from the power source circuit 10 to the external equipment 9. During the background charging mode, the residual small current (background current) supplied from the power source circuit 10 to the external circuit 9 is utilized to perform the charging.

During the background charging mode S40, the low current charging as shown by a step S41 is performed for the first stage period $P_A$. The low current charging is such charging in which the switch S4 is changed over at a pre-set frequency under control of the micro-computer (CPU) 11 in order to cause the pre-set small current (background current) to flow through the battery main unit 4 for charging. This small current or background current is the residual current equal to the maximum current supplied by the power source circuit 10 less the maximum current consumed by the external circuit 9, and amounts to one-fifth to one-tenth, for example, one-eighth of the usual charging current. Thus the current amounts to approximately 0.5 A in the present embodiment. If charging is performed within a range that does not exceed this small current value, there is no inconvenience caused even when the current consumed by the external equipment 9 peaks.

The switching frequency may for example be on the order of 20 kHz. It is however preferable to control the switching frequency or the pulse width to stabilize the charging current at the above-mentioned small current value of 0.5 A with the aid of the so-called dc chopper configuration.

This low current charging is continued until it is determined at a step S42 that the cell voltage has exceeded a pre-set voltage threshold $T_{v1}$. The threshold value $T_{v1}$ is set to, for example, 3.5 V to 4.0 V.

When it is determined at step S42 that the cell voltage has exceeded the threshold value $T_{v1}$ the charging period proceeds to a second stage period $P_c$ when the constant voltage charging at a step S43 is performed. This constant voltage charging is performed under a constant voltage, for example, in a substantially constant voltage range of from about 8.2 V to a full-charge voltage of 8.4 V±0.2 V, with the switch S4 being maintained in the turned-on state. The charging current at this time is designed not to exceed the above-mentioned small current or the background current. This may be achieved by pre-setting the condition of transfer from the period $P_A$ to the period $P_C$ such as the threshold value $T_{v1}$ of the cell voltage, in such a manner that the charging current may be suppressed to a value smaller than the background current even although the switch S4 is maintained in the turned-on state.

If, as a result of the constant voltage charging, the charging current I is found to be smaller than a pre-set current value, such as 150 mA, control proceeds to a step S45a to start e.g. a 30-minute timer. It is then checked at a step S45b whether or not the time period of 30 minutes has elapsed. After lapse of the 30-minute period, control proceeds to the next step S46. This 30-minute charging is termed a charging for assurance. That is, charging is continued for 30 minutes further even if the charging current becomes lower than 150 mA before the timer runs out.

At the next step S46, the switch S4 is turned off and the voltage of each cell in the battery main unit 4 is checked, before control proceeds to a step S47. At the step S47, it is determined whether or not voltage differences between the cell voltages, that is voltage fluctuations, exceed 0.2 V. If the result of determination is NO, control proceeds to a step S48. If the result is YES, control proceeds to a step S49.

At the step S48, after a stand-by period of, for example, 12 hours, control reverts to the step S41 which is the first step of the present background charging mode. This stand-by period corresponds to the period $P_D$ while the time period during which control reverts to the step S41 to effect the charging corresponds to the supplementary charging period $P_E$. This supplementary charging means the charging of eking out the spontaneous discharge. By automatically repeating the charging operation at an interval of 12 hours, an optimum charging voltage state may be maintained at all times.

At a step S49, because the voltage difference between the cell voltages is 0.2 V or higher, the cell exhibiting the maximum voltage is discharged. When an equalized voltage among the cells is reached, control reverts to the step S41 to re-initiate the charging. This process achieves full charging while maintaining the optimum voltage balance among the cells of the battery main unit 4 (cell balance).

Figure 6:
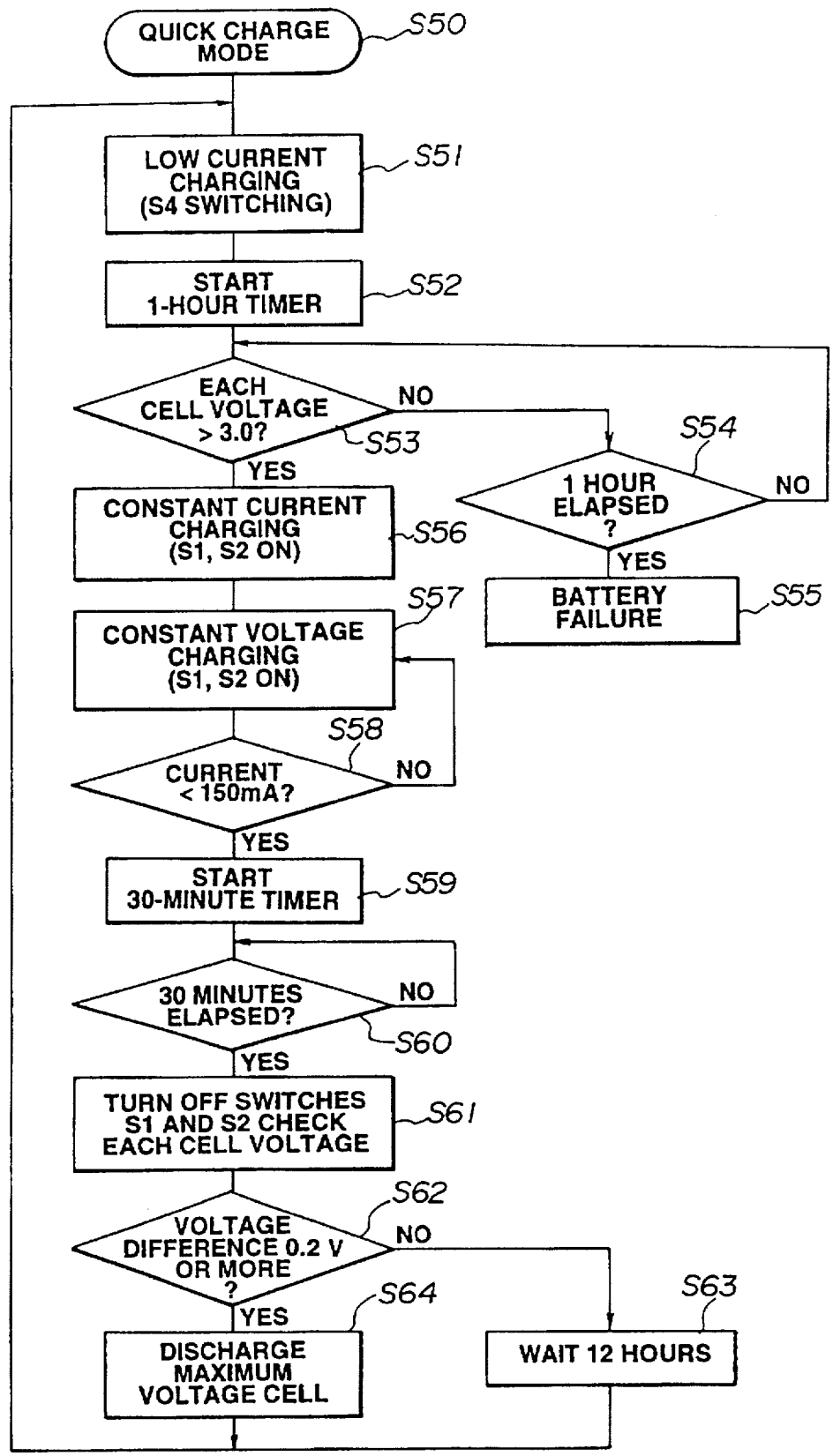
FIG. 6 is a flowchart for illustrating the background discharging mode among the charge/discharging control operations of the embodiment of FIGS. 1 and 2.
Figure 7:
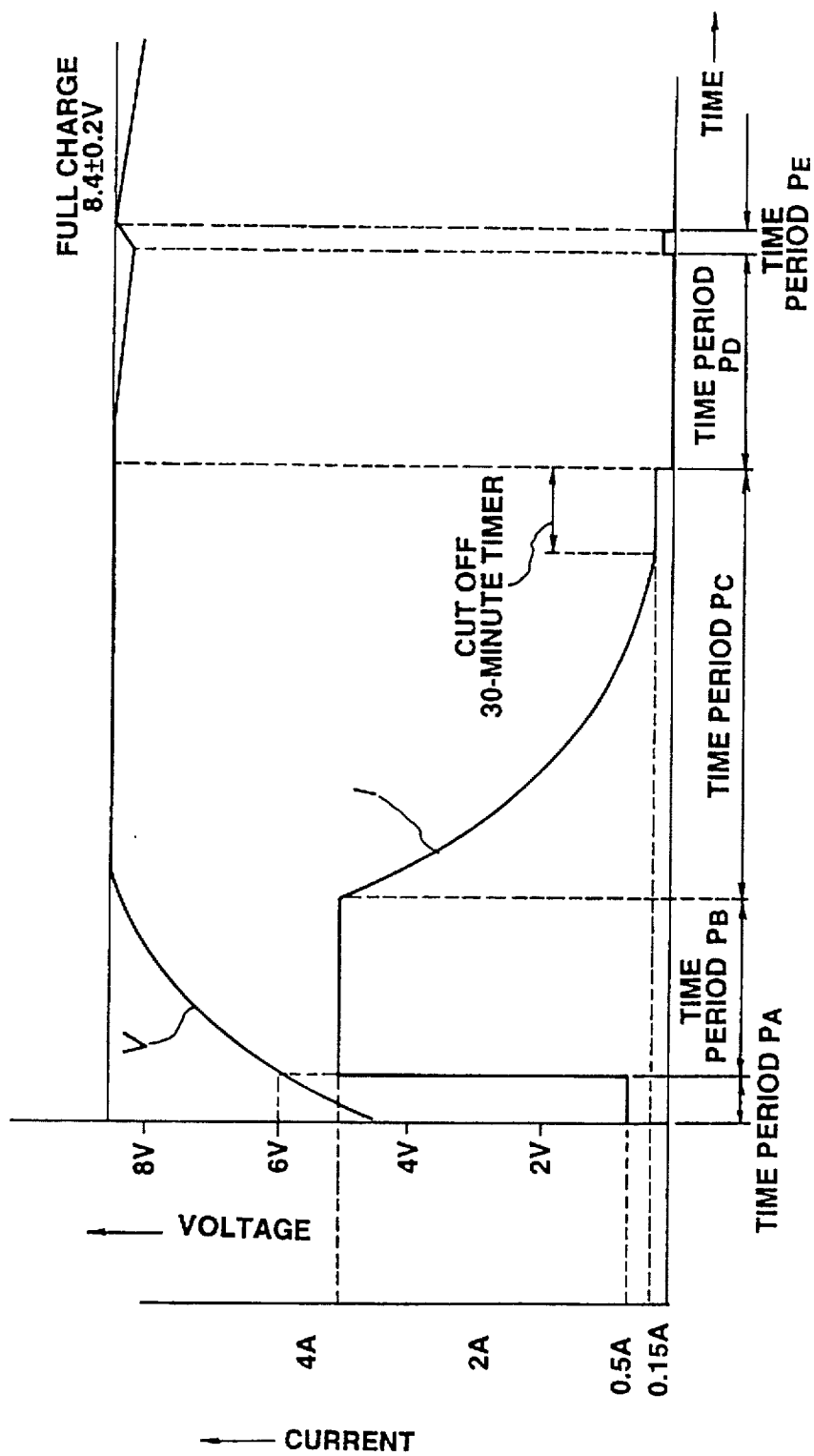
FIG. 7 is a graph showing changes in the current and the voltage with lapse of time in the quick charging mode.

The quick charge mode S50, which is established when the AC (power source)/PC (external equipment) state is determined to be such that the AC (power source) is on and the PC (external equipment) is off (S18), is explained by referring to the flowchart of FIG. 6 and the charging transition schema (charging process diagram) of FIG. 7.

In the quick charging mode, the battery main unit 4 of the battery pack 1 is charged when the external equipment 9 is turned off and the current from the power source circuit 10 is not supplied to the external equipment 9.

During this quick charging mode S50, the first stage period $P_A$ is the period during which the low current charging shown at a step S51 is performed. The low current charging is similar to the operation at the step S41 of the background charging mode, that is, the pre-set small current is caused to flow through the battery main unit 4 by switching over the switch S4 at a pre-set frequency under control by the micro-computer (CPU) 11. This small current may for example be one-eighth of the usual charging current or about 0.5 A. In the present example the changing current is equal to 0.5 A. The switching frequency is on the order of, for example, 20 kHz.

The operation of low current charging at step S51 of the quick charging mode S50 checks for possible problems such as short-circuiting or open-circuiting, of the battery main unit 4. The charging state of the battery main unit 4 is checked for each cell, in effect each group of the parallel-connected cells, making up the battery main unit 4. In more detail, it is determined whether, during the low current charging for a pre-set time period, for example one hour, each cell voltage reaches a pre-set voltage, such as 3.0 V, which is lower than the full-charge voltage of, for example, 4.2 V.

Specifically, a one-hour timer is started at a step S52. It is determined at the next step S53 if each cell voltage is larger than 3.0 V. If the result of the determination is NO, control proceeds to a step S54 in order to determine whether or not the time of one hour has elapsed. If the result of the step S54 is NO, control reverts to the step S53 and, if the result is YES, control proceeds to a step S55 to issue an alarm that the battery is in trouble. When there is one or more cells in which the voltage of 3.0 V is not reached after low current charging for one hour, that proceeds to the step S55. The quick charging mode is terminated, if so required, after issuing the above-mentioned alarm to the effect that the battery is in trouble.

When the result of decision at the step S53 is YES, that is if each cell voltage exceeds 3.0 V, control proceeds to a step S56 in order to carry out a constant current charging for a period $P_B$ as a second step of the quick charging mode S50. During this constant current charging, the switches S1 and S2 are turned on and the cells of the battery main unit 4, more specifically, each group of the parallel-connected cells, are charged at a pre-set current, for example, at the current of 4 A. At this time, the charging voltage of the battery main unit 4 is increased rapidly. When a voltage close to the full charging voltage, such as 8.2 V, is reached, the charging period proceeds to the next third period $P_C$ at a step S57 and the constant voltage charging is carried out. This constant voltage charging is carried out under a substantially constant voltage of from e.g. 8.2 V up to the full charging voltage of 8.4 V±0.2 V.

If, as a result of the constant voltage charging, the charging current is found at a step S58 to be smaller than, for example, 150 mA, control proceeds to a step S59 to cause e.g. a 30-minute timer to be started. It is determined at a step S60 if the time period of 30 minutes has elapsed. If the result is YES, control proceeds to the next step S61. This 30-minute charging is termed a charging for assurance. That is, charging is continued for 30 minutes further even if the charging current becomes lower than 150 mA before the timer runs out.

At the next step S61, the switches S1 and S2 are turned off and the cell voltages in the battery main unit 4 are checked before control proceeds to a step S62. At the step S62, it is determined whether or not voltage differences between the cell voltages, that is voltage fluctuations, exceed 0.2 V. If the result of decision is NO, control proceeds to a step S63. If the result is YES, control proceeds to a step S64.

At the step S63, after a stand-by period of, for example, 12 hours, control reverts to the step S51 which is the first step of the present quick charging mode. This stand-by period corresponds to the period $P_D$, while the time period during which control reverts to the step S51 to effect the charging corresponds to the supplementary charging period $P_E$. This supplementary charging means the charging of eking out the spontaneous discharge. By automatically repeating the charging operation at an interval of 12 hours, an optimum charging voltage state may be maintained at all times.

At a step S64, because the voltage difference between the cell voltages is 0.2 V or higher, the cell exhibiting the maximum voltage is discharged. When an equal voltage is reached, control reverts to the step S51 to re-initiate the charging. This process achieves full charging while maintaining the optimum voltage balance among the cells of the battery main unit 4 (cell balance).

During the period of the stand-by state following the end of the background charging or quick charging, such as the period $P_D$ shown in FIGS. 5 and 7, the switch S2 for charging is turned on. Thus, even if the power source circuit 10 is abruptly turned off, the discharge current may be supplied to the external equipment 9 via the switch S2 and the diode D3 instantly without relying on the decision given at the micro-computer 11. This prevents the occurrence of inconveniences caused by power down, such as data destruction.

During the above-described charge/discharge operations, inclusive of the above-mentioned wait mode, the charging and discharging operations of the battery main unit 4 are continually monitored by the micro-computer 11 and the analog circuit 12. The information on the states within the battery pack 1 during the charging and discharging operations and the inquiries from the external equipment 9 are exchanged via the external control terminal 8 between the micro-computer 11 and the external equipment 9. The function of the exchange of the information communication) is hereinafter explained.

The communication via the external control terminal 8 of the battery pack 1 of the present embodiment is by the asynchronous full duplex communication system, with transmitted data having an error check function and being based on eight bits as a unit. The start and stop bits are each one bit and the X-ON/X-OFF functions operate as handshaking. The standard for the communication may be changed as required.

Specific examples of data transmitted from the external equipment 9, such as a personal computer, to the micro-computer 11 in the battery pack 1 include the operational (OP) codes as shown in the following Table 1:

TABLE 1

| | queries of intrinsic information | queries of statuses | commands | declaration | |
|---|---|---|---|---|---|
| | | | upper | | |
| lower | 0  1 | 2 | 3 | 4 | ... F |
| 0 | model No. | full capacity | restart | wake up | . . |
| 1 | version | get capacity | set thresh 1 | suspend | . . |
| 2 | cell conf. | get voltage | set thresh 2 | charge | . . |
| 3 | type | get current | set thresh 3 | discharge | |
| 4 | vender | | set thresh 4 | sync | |
| 5 | | | set thresh 5 | async | |
| 6 | | | set thresh 6 | | |
| 7 | | | set thresh 7 | | |
| 8 | | | set thresh 8 | | |
| 9 | | | set thresh 9 | | |
| A | | | set thresh 10 | | |
| B | | | | | |
| C | | get volt. cell 1 | | | |
| D | | get volt. cell 2 | | | |
| E | | get volt. cell 3 | | | ... Repeat |
| F | | get volt. cell 4 | | suspend current | ... acknowledge |

In the OP codes, shown in Table 1, upper and lower four bits of each 8-bit word are represented by the hexadecimal notation. The contents of the communication are roughly classified into at least four kinds of communications which are the intrinsic information inquiry, the status inquiry, command and the declaration. Table 1 also gives examples of the OP codes for re-inquiry and acknowledgement.

Among items of the intrinsic information inquiry, there are, for example, those OP codes used for inquiring into the model numbers (Model Nos) proper to the battery pack, version, cell configuration, type and the venders. Among items of the status inquiry, there are those OP codes used for inquiring into the maximum capacity (Full Capacity), current capacity (Get Capacity), the number of times of charging (Get Cycle Nos), the present capacity (Get Voltage) or the present current (Get Current) and those OP codes used for inquiring into the cell voltages (Get Volt. Cell 1 etc). Among items of the command, there are OP codes used for re-starting the micro-computer 11 or setting various threshold voltages for alarms concerning excessive discharge (Set Thresh 1 etc). Among items of the declaration, there are those OP codes used for setting the status of the battery pack 1 from the external equipment 9, such as sync and async.

The above Table 1 shows specific examples of allocation of the OP codes to the portions of 256 8-bit words in which upper four bits are 1h to 4h, where h indicates that the number is hexadecimal, and also specific examples of allocation of the OP codes of re-inquiry (repeat) and acknowledgement to FEh and FFh. Any optional OP codes may also be allocated to the portions other than those given above. Specifically, the OP codes shown in Table 1 are those used by the user when communicating with the battery pack 1 via the external equipment 9. In addition, the OP codes for the maker to conduct adjustments and testing of the battery pack 1 may be allocated to the portions having the upper four bits of 8h to Ah.

Specific examples of the data codes transmitted from the micro-computer 11 within the battery pack 1 to the external equipment 9 such as the personal computer responsive to the OP codes transmitted from outside into the battery pack 1 are shown in Table 2.

A specific example of the communication between the external equipment 9, such as a personal computer, and the micro-computer 11 in the battery pack 1, is hereinafter explained. If 10h is sent from the external equipment 9 (host side) as an OP code inquiring into the model number of the battery pack (Model No), the data code of 0Ah ($10_{10}$) is returned back from the micro-computer 11 of the battery pack 1. The external equipment 9 (host side), which has pre-registered therein the connectable battery pack model number, decides whether or not the returned battery pack number is compatible. If the returned battery pack number is found to be not compatible, control proceeds to the operation of indication of the battery failure or termination of the charge/discharge operation.

TABLE 2

| lower | _____upper_____ | | | | | | | | | | | | | | | |
|---|---|---|---|---|---|---|---|---|---|---|---|---|---|---|---|
| | 0 | 1 | 2 | 3 | 4 | 5 | 6 | 7 | 8 | 9 | A | B | C | D | E | F |
| 0 | 0 | 16 | 32 | 48 | 64 | 80 | 96 | 112 | 128 | 144 | 160 | 176 | 192 | 208 | 224 | good morning (async) |
| 1 | 1 | 17 | 33 | 49 | 65 | 81 | 97 | 113 | 129 | 145 | 161 | 177 | 193 | 209 | 225 | low battery 0 (async) |
| 2 | 2 | 18 | 34 | 50 | 66 | 82 | 98 | 114 | 130 | 146 | 162 | 178 | 194 | 210 | 226 | low battery 1 (async) |
| 3 | 3 | 19 | 35 | 51 | 67 | 83 | 99 | 115 | 131 | 146 | 163 | 179 | 195 | 211 | 227 | low battery 2 (async) |
| 4 | 4 | 20 | 36 | 52 | 68 | 84 | 100 | 116 | 132 | 147 | 164 | 180 | 196 | 212 | 228 | battery failure (async) |
| 5 | 5 | 21 | 37 | 53 | 69 | 85 | 101 | 117 | 133 | 148 | 165 | 181 | 197 | 213 | 229 | end of battery (async) |
| 6 | 6 | 22 | 38 | 54 | 70 | 86 | 102 | 118 | 134 | 149 | 166 | 182 | 198 | 214 | 230 | resend |
| 7 | 7 | 23 | 39 | 55 | 71 | 87 | 103 | 119 | 135 | 150 | 167 | 183 | 199 | 215 | 231 | illegal |
| 8 | 8 | 24 | 40 | 56 | 72 | 88 | 104 | 120 | 136 | 151 | 168 | 184 | 200 | 216 | 232 | |
| 9 | 9 | 25 | 41 | 57 | 73 | 89 | 105 | 121 | 137 | 152 | 169 | 185 | 201 | 217 | 233 | |
| A | 10 | 26 | 42 | 58 | 74 | 90 | 106 | 122 | 138 | 153 | 170 | 186 | 202 | 218 | 234 | |
| B | 11 | 27 | 43 | 59 | 75 | 91 | 107 | 123 | 139 | 154 | 171 | 187 | 203 | 219 | 235 | |
| C | 12 | 28 | 44 | 60 | 76 | 92 | 108 | 124 | 140 | 155 | 172 | 188 | 204 | 220 | 236 | |
| D | 13 | 29 | 45 | 61 | 77 | 93 | 109 | 125 | 141 | 156 | 173 | 189 | 205 | 221 | 237 | |
| E | 14 | 30 | 46 | 62 | 78 | 94 | 110 | 126 | 142 | 157 | 174 | 190 | 206 | 222 | 238 | |
| F | 15 | 31 | 47 | 63 | 79 | 95 | 111 | 127 | 143 | 158 | 175 | 191 | 207 | 223 | 239 | acknowledge |

Referring to Table 2, the words 00h to EFh, where h indicates that the number is the hexadecimal number, represent the corresponding values of $0_{10}$ to $10_{239}$. For example, salutation on starting the micro-computer (Good Morning) is allocated to F0h, the notification that the three low-voltage threshold values have been reached (low battery 0, low battery 1 and low battery 2) are allocated to F1h, F2h and F3h, respectively, the notification that the battery is in trouble (Battery Failure) is allocated to F4h and the notification that the battery has reached its end (End of Battery) is allocated to F5h. These notifications are issued in synchronism with the inquiry timing from the external equipment 9. However, if the status of the micro-computer 11 is rendered asynchronous (Async) by the OP code for the declaration for asynchronism (44h) having been transmitted from the external equipment 9, the above notifications may also be sent synchronously, that is without regard to the inquiries from the external equipment 9. The request for retransmission (Resend) and the notification that the transmission data is invalid or out of standard (Illegal) are allocated to F6h and F7h, respectively, while the acknowledgement that data from the external equipment 9 has been received (Acknowledge) is allocated to FFh.

Among the above three voltage threshold values, Low Battery 0, Low Battery 1 and Low Battery 2 correspond to a voltage for which restart becomes impossible on power off, a voltage instructing the transfer of the memory information of the external equipment 9 to a hard disc or the like and a voltage instructing the termination of transfer of the memory information of the external equipment 9 to the hard disc or the like, respectively.

In addition, various control operations are carried out by the external equipment 9 (host side) making inquiries or settings to the battery pack 1, and by the battery pack 1 sending responses thereto.

Figure 8:
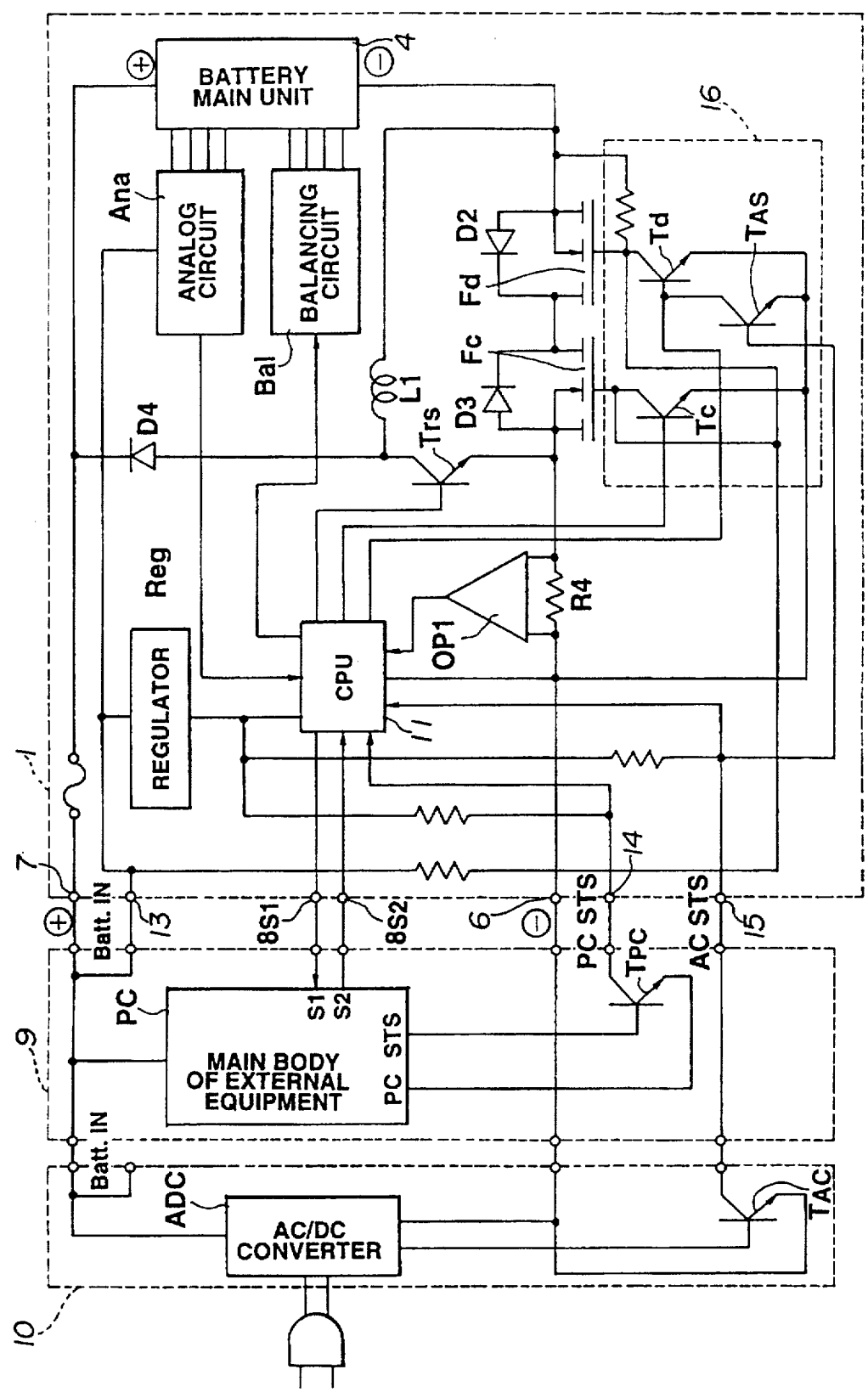
FIG. 8 is a schematic block circuit diagram showing the structure of a circuit of a modified embodiment of the battery pack according to the present invention and a peripheral circuit.

FIG. 8 shows, in a block circuit diagram, a circuit of the battery pack according to a second embodiment of the present invention, and its peripheral circuitry.

Referring to FIG. 8, an analog circuit Ana is equivalent to the analog circuit 12 of the embodiment shown in FIG. 2, while FETs (field effect transistors) Fc and Fd are equivalent to the switches S1 and S2 of FIG. 2 and a transistor Trs is equivalent to the switch S4 in FIG. 2. The parts of FIG. 8 equivalent to those shown in FIG. 2 are indicated by the same reference numerals and the corresponding description is omitted or simplified for clarity.

In the embodiment of FIG. 8, the connection terminals of the battery pack 1 include, in addition to a negative terminal 6, a positive terminal 7 and an external connection terminal 8 (an output terminal $8_{s1}$ and an input terminal $8_{s2}$ in FIG. 8), which are similar to those shown in FIG. 2, a battery-in (Batt. IN) terminal 13, a PC status (status of the external equipment PC STS), input terminal 14 and an AC status (power source status, AC STS) input terminal 15.

The battery-in (Batt. IN) terminal 13 is used on loading the battery pack 1 in order to supply the power from the power source to the circuitry in the battery pack 1 through the external connection equipment in addition to supplying the power through a power source line in the battery main unit 4. To this end, the battery-in (Batt. IN) terminals of the external equipment 9 and the power source circuit 10 are connected to the positive side power source lines within the external equipment 9 and the power source circuit 10, respectively. With this constitution, if the negative terminal 6 or the positive terminal 7 of the battery pack 1 are shorted from outside or are connected incorrectly to the power source terminals, the circuitry within the battery pack 1 is not actuated, so that no ill effects are produced.

Within the external equipment 9, there are provided a main body of the external equipment PC, such as a personal computer, and a transistor $T_{PC}$ which is turned on when the main body of the external equipment PC is turned on. Within the power source circuit 10, there are provided an AC/DC converter ADC and a transistor $T_{AC}$ which is turned on when the AC/DC converter ADC is turned on. The PC status (status of the external equipment) information PC STS from the transistor $T_{PC}$ is sent to the micro-computer (CPU) 11 via a PC status terminal 14 in the battery pack 1, while the AC status (power source status) information AC STS from the transistor $T_{AC}$ is sent to the micro-computer (CPU) 11 via an AC status terminal 15 in the battery pack 1.

Within the battery pack 1, a regulator (voltage stabilization circuit) Reg and the analog circuit Ana are connected to the battery-in (Batt. IN) terminal 13 for supplying the power thereto. The battery-in terminal 13 is also connected to various gates of the FETs Fc and Fd via a resistor and a switch control circuit 16. In this manner, when the battery pack is loaded in position, the FETs Fc and Fd are both turned on, so that the power may be supplied from the negative terminal of the battery main body 4 to the negative terminal 6 of the battery pack 1 even if the AC/DC converter ADC of the power source circuit 10 is turned off. The stabilized voltage output of the regulator Reg is supplied to the CPU 11. The analog circuit Ana detects the voltage for each cell of the battery main unit 4 and transmits the detected voltage to the CPU 11.

The PC status (status of the external equipment PD STS) from the input terminal 14 and the AC status (status of the power source AC STS) from the input terminal 15 are transmitted to the CPU 11 where the AC PC status detection as in step S13 of the flowchart of FIG. 3 is performed. Depending on the detected AC PC status, the wait mode operation, discharge mode operation, background mode operation or the quick charge mode operation is executed.

During execution of these modes, the CPU 11 executes calculations based upon the cell voltage values from the analog circuit Ana, charging/discharging current values from the operational amplifier OP1 and the temperature from a temperature sensor in order to find a voltage for a given current value as calculated from the current actual voltage value or find the data such as residual capacity or the maximum capacity. Also, the CPU 11 transmits necessary data responsive to the inquiries made from the external equipment 9. It is noted that the voltage for a pre-set constant voltage is found as described above in that the voltage for larger current values is low and, if directly used for condition discrimination, is likely to lead to mistaken decisions. Also, since the present detected voltage is changed with temperatures, it should be corrected in consideration of temperature characteristics. Besides, it may also be contemplated to correct the residual voltage or the maximum capacity depending on the current or the temperature.

As described in connection with the steps S47 and S49 or S62 and S64 of the flowcharts of FIGS. 4 and 6, the balancing circuit Bal discharges the cell exhibiting the maximum voltage when the difference between the cell voltages exceeds 0.2 V in order to equalize the cell voltages and in order to establish a voltage balance from cell to cell.

To this end, the CPU 11 discriminates the cell voltages as detected by the analog circuit Ana and controls the balancing circuit Bal when the voltage difference exceeds 0.2 V to turn on one of the discharge switches of the cells showing the maximum voltage.

Each of the FETs Fc and Fd, which are charge/discharge control switches, has its gate voltage controlled by the switch control circuit 16 so as to be turned on or off. That is, the FET Fc has its gate connected to the collector of the transistor Tc, while the FET Fd has its gate connected to the collector of the transistor Td, and a control signal from the CPU 11 is supplied to the bases of these transistors Tc and Td. The transistor Td has its base connected to the collector of a transistor $T_{AS}$, the base of which is connected to the AC status input terminal 15.

Also, as described above, the battery-in terminal 13 is connected via a resistor to the gates of the FETs Fc and Fd, so that these FETs Fc and Fd are controlled responsive to the loading of the battery pack 1, that is responsive to the voltage application to the battery-in terminal 13.

If, when the battery pack 1 is loaded in position, the transistors Tc and Td are turned off, the FETs Fc and Fd are both turned on, such that, if the transistors Tc and Td are turned on responsive to the control signal from the CPU 11, the FET connected to the transistor which has been turned on is turned off. It may also occur that, if both the transistors Tc and Td are turned on, both the FETs Fc and Fd are turned off.

The transistor $T_{AS}$ within the switch control circuit 16 is turned on and off depending on the voltage at the AC status input terminal 15. That is, if the power source circuit 10 is turned on, the transistor $T_{AC}$ within the power source circuit 10 is turned on, so that the voltage at the terminal 15 is at a low (L) level. The transistor Td is turned on and off depending on the control signal from the CPU 11. Conversely, if the power source circuit 10 is turned off or disconnected, the voltage at the AC status input terminal 15 becomes high (H). Thus the transistor $T_{AS}$ is turned on so that the base of the transistor $T_d$ is forced to be at a low level and hence the FET Fd is turned on.

That is, if, during the above-mentioned background charging mode, with the AC (power source) being turned on, the PC (external equipment) being turned off, the FET Fd or the transistor Trs being turned off, and the electrical connection of the power source circuit 10 being interrupted, the power source of the external equipment 9, such as the personal computer 9, is interrupted temporarily, data destruction or the like inconvenience may be produced. In this consideration, the transistor $T_{AS}$ is directly turned on by an analog technique for instantaneously turning the FET Fd on without waiting for the decision as to the AC status to be given by the CPU 11. In other words, If the FET Fd is turned on based upon the decision given by the CPU 11, the time lag corresponding to the execution of the discrimination program is produced and a delay is caused in the power supply from the battery main unit 4 to the external equipment 9, so that there is the risk of power supply interruption if for a shorter period of time. With the arrangement of FIG. 8, the FET Fd is turned on simultaneously with change in the AC status, that is with the minimum delay on the order of the transistor switching time, for supplying the power instantly from the battery main unit 4 to the external equipment 9 in order to prevent data destruction or the like inconvenience from its occurrence.

Although the FETs Fc and Fd, which are switches for controlling the charging/discharging, are connected in the above embodiment to the negative side power source line, they may also be connected to the positive side power source line. The arrangement of the switch controlling circuit 16 may be configured in a manner different from that shown in the drawings. Alternatively, the switching control circuit 16 may be omitted so that the FETs Fc and Fd may be turned on and off based upon a control signal supplied from the CPU 11. In addition, the negative terminal of the CPU 11 may also be connected to the negative terminal of the battery main unit 4.

It will be seen from above that the present invention provides a battery pack in which the control circuit provided heretofore in the charger or the external equipment is provided within the battery pack itself for simplifying the structure of the charger or the external equipment in order to reduce the size and the cost of the battery pack.

As regards the operation of the control circuit, the charging and discharging operations are performed based upon the charging transition diagram or the charging process diagram, so that the charging and discharging operations may be adapted to the characteristics of the secondary battery incorporated in the battery pack, with the result that the charging voltage of each cell may be continuosly maintained in a normal condition.

In addition, since the charging and discharging states of each secondary cell may be detected, the state of each cell may be detected promptly for promptly detecting the unbalanced state, excessively charged state or the excessively discharged state.

Furthermore, by providing the function of detecting the input voltage from the charger, it becomes possible to detect the voltage other than the charging voltage of the battery pack in order to prevent the destruction of the cells making up the secondary battery of the battery pack from occurring.

What is claimed is:

1. A battery pack connected to a power source circuit and to external equipment comprising:
    a battery unit charged by the power source circuit;
    detection means for detecting whether the external equipment is on or off and whether the power source circuit is on or off; and
    control means for controlling charging and discharging of the battery unit in response to the on or off status of both the external equipment and the power source circuit.

2. The battery pack as claimed in claim 1, further comprising:
    a switch connected between the battery unit and the power source circuit;
    means for controlling the switch;
    wherein, when said power source circuit is detected to be on, the battery unit is charged with a reduced current.

3. The battery pack as claimed in claim 2, wherein:
    the battery unit comprises a plurality of cells;
    the battery pack further comprises means for detecting the voltage of the cells; and
    the charging of the battery unit with the reduced current continues until the voltage of said cells exceeds a threshold.

4. The battery pack as claimed in claim 2, wherein the switch is a transistor.

5. The battery pack as claimed in claim 1, wherein the battery unit is charged by a constant current which is created by controlling a total current from the power source circuit.

6. The battery pack as claimed in claim 1, wherein a discharge switch is turned on when the charging of the battery unit has ceased.

7. The battery pack as claimed in claim 1, wherein:
    the external equipment may be powered by either the battery pack or the power source circuit; and
    when the external equipment and said power source circuit have both been on and said power source is turned off, the battery pack immediately and automatically supplies power to the external equipment.

8. The battery pack as claimed in claim 1, further comprising a battery loading terminal to which a voltage is supplied when the battery pack is loaded, wherein an internal circuit of the battery pack is rendered operational or non-operational depending on the voltage at the battery loading terminal.

9. The battery pack as claimed in claim 8, wherein the detection means comprise a voltage divider and an analog circuit for detecting said voltage.

10. The battery pack as claimed in claim 1, wherein the charging of the battery pack is accomplished with a power equal to or less than a total power supplied by the power source circuit minus a maximum power consumed by the external equipment when the detection means detects that both the external equipment and the power source circuit are on.

11. The battery pack as claimed in claim 1, wherein the battery pack goes into a wait mode when both the external equipment and the power source circuit are detected to be off.

12. The battery pack as claimed in claim 1, wherein the battery pack goes into a discharge mode when the external equipment is detected to be on and the power source circuit is detected to be off.

13. The battery pack as claimed in claim 1, wherein the battery pack goes into a background charging mode when both the external equipment and the power source circuit are detected to be on.

14. The battery pack as claimed in claim 1, wherein the battery pack goes into a quick charging mode when the external equipment is detected to be off and the power source circuit is detected to be on.

15. The battery pack as claimed in claim 1, wherein the control means, the detection means and the battery unit are located within a housing of the battery pack.

16. The battery pack as claimed in claim 1, wherein the control means include a micro-computer and a fuse connected between battery unit and the power source circuit which fuse is controlled by the micro-computer.

17. The battery pack as claimed in claim 1, further comprising a protection circuit responsive to the current or voltage of the power source circuit and which comprises an operational amplifier having two input terminals, a resistor connected between the terminals, one terminal connected to the power source circuit and the other terminal connected to the battery unit.

18. The battery pack as claimed in claim 17, wherein the protection circuit further comprises:
    a diode with a cathode connected to a positive terminal of the power source circuit; and
    a resistor connected in series with the diode and connected to a negative terminal of the power source circuit.

19. The battery pack as claimed in claim 1, wherein the control means further comprise:
    a micro-computer; and
    a first switch and a second switch connected in series between the battery unit and the power source circuit;
    wherein the first and second switches are controlled by the micro-computer to effect charging and discharging of the battery unit.

20. The battery pack as claimed in claim 19, wherein the first and second switches are transistors.

21. The battery pack as claimed in claim 19, wherein said first switch is connected in parallel with a diode and said diode has a cathode connected to the power source circuit and an anode connected to the series connection between the first and second switches.

22. The battery pack as claimed in claim 19, wherein said second switch is connected in parallel with a diode and said diode has a cathode connected to the battery unit and an anode connected to the series connection between the first and second switches.

23. A battery pack connected to a power source circuit and to external equipment comprising:

a battery unit charged by the power source circuit;

detection means for detecting whether the external equipment and the power source circuit are on or off; and control means for controlling charging and discharging of the battery unit in response to the on or off status of both the external equipment and the power source circuit wherein:
   the battery unit comprises a plurality of cells;
   said battery pack comprises means for detecting and comparing voltages of the cells; and
   a cell having a maximum voltage is discharged when a voltage difference between the cells exceeds a threshold.

24. A battery pack comprising:

a battery unit which can be charged and discharged;
   terminals which allow the battery pack to be connected to a power source circuit and to external equipment;
   detection means for detecting whether the power source circuit is on or off and whether the external equipment is on or off;
   control means for controlling charging and discharging of the battery unit in response to the detection means; and
   a housing for enclosing the battery unit, the detection means and the control means.

25. A battery pack comprising:

a battery unit comprising a plurality of cells which can be charged and discharged;
   terminals which allow the battery pack to be connected to a power source circuit and external equipment;
   detection means for detecting and comparing the voltages of each of the cells and determining when a voltage difference between the cells exceeds a threshold; and
   means for discharging a cell having a voltage higher than other cells when said voltage difference is determined to exceed the threshold.

26. A battery pack as claimed in claim 25, further comprising:

detection means for detecting whether the external equipment is on or off and whether the power source circuit is on or off; and
   control means for controlling charging and discharging of the battery unit in response to the on or off status of both the external equipment and the power source circuit.

27. The battery pack as claimed in claim 26, further comprising:

a switch connected between the battery unit and the power source circuit;
   means for controlling the switch;
   wherein, when said power source circuit is detected to be on, the battery unit is charged with a reduced current.

28. The battery pack as claimed in claim 27, wherein:
   the battery unit comprises a plurality of cells;
   the battery pack further comprises means for detecting the voltage of the cells; and
   the charging of the battery unit with the reduced current continues until the voltage of said cells exceeds a threshold.

29. The battery pack as claimed in claim 27, wherein the switch is a transistor.

30. The battery pack as claimed in claim 26, wherein the battery unit is charged by a constant current which is created by controlling a total current from the power source circuit.

31. The battery pack as claimed in claim 26, wherein a discharge switch is turned on when the charging of the battery unit has ceased.

32. The battery pack as claimed in claim 26, wherein:
   the external equipment may be powered by either the battery pack or the power source circuit; and
   when the external equipment and said power source circuit have both been on and said power source is turned off, the battery pack immediately and automatically supplies power to the external equipment.

33. The battery pack as claimed in claim 26, further comprising a battery loading terminal to which a voltage is supplied when the battery pack is loaded, wherein an internal circuit of the battery pack is rendered operational or non-operational depending on the voltage at the battery loading terminal.

34. The battery pack as claimed in claim 33, wherein the detection means comprise a voltage divider and an analog circuit for detecting said voltage.

35. The battery pack as claimed in claim 26, wherein the charging of the battery pack is accomplished with a power equal to or less than a total power supplied by the power source circuit minus a maximum power consumed by the external equipment when the detection means detects that both the external equipment and the power source circuit are on.

36. The battery pack as claimed in claim 26, wherein the battery pack goes into a wait mode when both the external equipment and the power source circuit are detected to be off.

37. The battery pack as claimed in claim 26, wherein the battery pack goes into a discharge mode when the external equipment is detected to be on and the power source circuit is detected to be off.

38. The battery pack as claimed in claim 26, wherein the battery pack goes into a background charging mode when both the external equipment and the power source circuit are detected to be on.

39. The battery pack as claimed in claim 26, wherein the battery pack goes into a quick charging mode when the external equipment is detected to be off and the power source circuit is detected to be on.

40. The battery pack as claimed in claim 26, wherein the control means, the detection means and the battery unit are located within a housing of the battery pack.

41. The battery pack as claimed in claim 26, wherein the control means include a micro-computer and a fuse connected between battery unit and the power source circuit which fuse is controlled by the micro-computer.

42. The battery pack as claimed in claim 26, further comprising a protection circuit responsive to the current or voltage of the power source circuit and which comprises an operational amplifier having two input terminals, a resistor connected between the terminals, one terminal connected to the power source circuit and the other terminal connected to the battery unit.

43. The battery pack as claimed in claim 42, wherein the protection circuit further comprises:

a diode with a cathode connected to a positive terminal of the power source circuit; and a resistor connected in series with the diode and connected to a negative terminal of the power source circuit.

44. The battery pack as claimed in claim 26, wherein the control means further comprise:

a micro-computer; and a first switch and a second switch connected in series between the battery unit and the power source circuit;

wherein the first and second switches are controlled by the micro-computer to effect charging and discharging of the battery unit.

45. The battery pack as claimed in claim 44, wherein the first and second switches are transistors.

46. The battery pack as claimed in claim 44, wherein said first switch is connected in parallel with a diode and said diode has a cathode connected to the power source circuit and an anode connected to the series connection between the first and second switches.

47. The battery pack as claimed in claim 44, wherein said second switch is connected in parallel with a diode and said diode has a cathode connected to the battery unit and an anode connected to the series connection between the first and second switches.

48. A battery pack as claimed in claim 26, further comprising a housing for enclosing the battery unit, the detection means and the control means.

* * * * *